(12) United States Patent
Becker et al.

(10) Patent No.: US 11,519,934 B2
(45) Date of Patent: Dec. 6, 2022

(54) METHOD FOR CALIBRATING A SENSOR SYSTEM

(71) Applicant: Robert Bosch GmbH, Stuttgart (DE)

(72) Inventors: Hanna Becker, Reutlingen (DE); Juergen Gut, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 547 days.

(21) Appl. No.: 16/582,503

(22) Filed: Sep. 25, 2019

(65) Prior Publication Data

US 2020/0102210 A1    Apr. 2, 2020

(30) Foreign Application Priority Data

Sep. 27, 2018 (DE) .......................... 102018216543.2

(51) Int. Cl.
| | |
|---|---|
| *G01P 21/00* | (2006.01) |
| *G01D 18/00* | (2006.01) |
| *G01R 33/00* | (2006.01) |
| *G01R 33/028* | (2006.01) |
| *G01R 35/00* | (2006.01) |

(52) U.S. Cl.
CPC .............. *G01P 21/00* (2013.01); *G01D 18/00* (2013.01); *G01R 33/0035* (2013.01); *G01R 33/0286* (2013.01); *G01R 35/005* (2013.01)

(58) Field of Classification Search
CPC ..... G01P 21/00; G01D 18/00; G01R 33/0035; G01R 33/0286; G01R 35/005
See application file for complete search history.

(56) References Cited

U.S. PATENT DOCUMENTS

| | | | | |
|---|---|---|---|---|
| 6,871,411 B1 * | 3/2005 | Kang | ..................... | G01C 17/38 |
| | | | | 33/356 |
| 9,081,717 B2 * | 7/2015 | Liikanen | ........... | H03M 13/3738 |
| | (Continued) | | | |

FOREIGN PATENT DOCUMENTS

| | | |
|---|---|---|
| DE | 102013222316 A1 | 5/2015 |
| DE | 102013212485 B4 | 5/2017 |
| | (Continued) | |

OTHER PUBLICATIONS

Machine translation of WO2017129208A1 (Year: 2017).*
Machine translation of JP2016194447A (Year: 2016).*

*Primary Examiner* — Douglas X Rodriguez
*Assistant Examiner* — Sangkyung Lee
(74) *Attorney, Agent, or Firm* — Norton Rose Fulbright US LLP; Gerard Messina (57) ABSTRACT

A method for calibrating a sensor system, including: providing at least one first sensor unit and one second sensor unit, providing first correction data for the first sensor unit on the basis of measuring signals of the first sensor unit, providing second correction data for the first sensor unit, in the case of an activated second sensor unit, on the basis of measuring signals of the first sensor unit and on the basis of measuring signals of the second sensor unit, determining a first quality parameter for the first correction data and a second quality parameter for the second correction data, determining present correction data for measuring signals of the first sensor unit based on the correction data having the highest of the two determined quality parameters, and calibrating the first sensor unit by correcting first measuring signals on the basis of the present correction data.

6 Claims, 4 Drawing Sheets

(56) References Cited

U.S. PATENT DOCUMENTS

| | | | | |
|---|---|---|---|---|
| 9,807,725 B1* | 10/2017 | Vitus | ............... | G01S 5/0263 |
| 2014/0373595 A1* | 12/2014 | Glueck | ............ | G01C 25/005 |
| | | | | 73/1.38 |
| 2019/0265074 A1* | 8/2019 | Gaydov | ............ | G01D 21/00 |

FOREIGN PATENT DOCUMENTS

| | | | | |
|---|---|---|---|---|
| JP | 2016194447 A | * | 11/2016 | |
| WO | WO-2008068542 A1 | * | 6/2008 | ............ G01C 21/16 |
| WO | WO-2017129208 A1 | * | 8/2017 | ............ G01D 18/00 |

\* cited by examiner

METHOD FOR CALIBRATING A SENSOR SYSTEM

RELATED APPLICATION INFORMATION

The present application claims priority to and the benefit of German patent application no. 10 2018 216 543.2, which was filed in Germany on Sep. 27, 2018, the disclosure of which is incorporated herein by reference.

FIELD OF THE INVENTION

The present invention relates to a method for calibrating a sensor system. The present invention furthermore relates to a sensor system. Although the present invention is generally applicable to arbitrary sensor systems, the present invention is described with reference to MEMS sensor systems.

BACKGROUND INFORMATION

Sensor systems may be implemented as micro-electromechanical systems, abbreviated MEMS. However, they may generally only be manufactured having a limited accuracy. In this way, the signals of sensors of the sensor system may contain systematic errors. Known systematic errors are, inter alia, the offset, sensitivity, and their temperature dependence. Since these systematic errors may differ from sensor to sensor, a direct compensation of the errors in the manufacturing process is comparatively complex and costly, since the corresponding correction parameters have to be component-specifically ascertained.

In addition to systematic errors present in the delivery state, they may further change due to the further processing and the installation into a device, for example, a smart phone. For example, the offset of an acceleration sensor may change during the further processing due to mechanical tensions in the assembly process. In the case of magnetometers, it is possible that the magnetic field to be measured is superposed by magnetic fields of other system components in the unit. This may result in a systematic offset of the sensor signal.

In the case of high demands on the quality of the sensor signals, using methods which may progressively determine correction parameters over the service life of the unit on the basis of the sensor signals has become known. These correction parameters may be used to filter systematic errors out of the sensor signals.

SUMMARY OF THE INVENTION

In one specific embodiment, the present invention provides a method for calibrating a sensor system, including the steps:
providing at least one sensor unit and one second sensor unit,
providing first correction data for the first sensor unit on the basis of measuring signals of the first sensor unit,
providing second correction data for the first sensor unit in the case of an activated second sensor unit on the basis of measuring signals of the first sensor unit and on the basis of measuring signals of the second sensor unit,
determining a first quality parameter for the first correction data and a second quality parameter for the second correction data,
determining present correction data for measuring signals of the first sensor unit based on the correction data having the highest of the two determined quality parameters, and
calibrating the first sensor unit by correcting first measuring signals on the basis of the present correction data.

In another specific embodiment, the present invention provides a sensor system, including a first sensor unit, a second sensor unit, a correction unit for providing first correction data for the first sensor unit on the basis of measuring signals of the first sensor unit, and for providing second correction data for the first sensor unit in the case of an activated second sensor unit on the basis of measuring signals of the first sensor unit and on the basis of measuring signals of the second sensor unit, a quality unit for determining a first quality parameter for the first correction data and a second quality parameter for the second correction data, an ascertainment unit for determining present correction data for measuring signals of the first sensor unit based on the correction data having the highest of the two determined quality parameters, a calibration unit for calibrating the first sensor unit by correcting first measuring signals on the basis of the present correction data, and an output unit for outputting corrected measuring signals of the first sensor unit.

One of the advantages thus achieved is that a high degree of accuracy in the calibration of the sensor system is enabled in a flexible manner as a function of the activity state of the second sensor unit. A further advantage is a rapid and power-saving determination of correction parameters and thus of the calibration of the sensor system, in particular during use of the sensor system in portable devices.

Further features, advantages, and other specific embodiments of the present invention are described hereafter or thus become obvious.

According to one advantageous refinement, the provision of first and/or second correction data takes place continuously. The advantage of this is that suitable present correction data may be provided continuously, which enhances the accuracy of the corrected measuring signals.

According to one advantageous refinement, first and/or second correction data are stored and upon further determination of first and/or second correction data and presence of a particular higher quality parameter, stored first and/or second correction data having a lower quality parameter are discarded and replaced by the determined first and/or second correction data having a higher quality parameter. This enables a continuous improvement of the accuracy of the calibration of the sensor system.

According to one advantageous refinement, stored first and/or second correction data are discarded after a predefinable time span has elapsed. This enhances the flexibility, so that, for example, a drop in the quality over a certain time, which may reflect a change of environmental conditions, may be compensated for, since predetermined correction data are then no longer up to date in spite of higher earlier quality, for example.

According to another advantageous refinement, the first sensor unit is provided with at least two different sensors. Different sensors may thus be calibrated in a simple manner.

According to another advantageous refinement, the first sensor device is provided including a magnetometer and/or an acceleration sensor and the second sensor device is providing including a rotation rate sensor. A simple implementation in, for example, portable devices is thus possible or existing sensors in these devices may be calibrated in a simple and reliable manner.

According to another advantageous refinement, the determination of present correction data is carried out on the basis of monitoring data of a monitoring unit. In this way, it is ensured that due to a malfunction established by the monitoring unit, for example, only suitable correction data are provided for the calibration.

According to another advantageous refinement, the determination of the present correction data on the basis of the second correction data is only carried out if the second sensor device is activated. An effective calibration is thus enabled with optimized power consumption of the sensor system at the same time.

Further important features and advantages of the present invention result from the subclaims, the drawings, and the associated description of the figures on the basis of the drawings.

It is apparent that the above-mentioned features and the features to be explained hereafter are usable not only in the particular specified combination, but rather also in other combinations or alone, without departing from the scope of the present invention.

Specific configurations and specific embodiments of the present invention are shown in the drawings and are explained in greater detail in the following description, identical reference numerals referring to identical or similar or functionally-identical components or elements.

DETAILED DESCRIPTION

Figure 1:
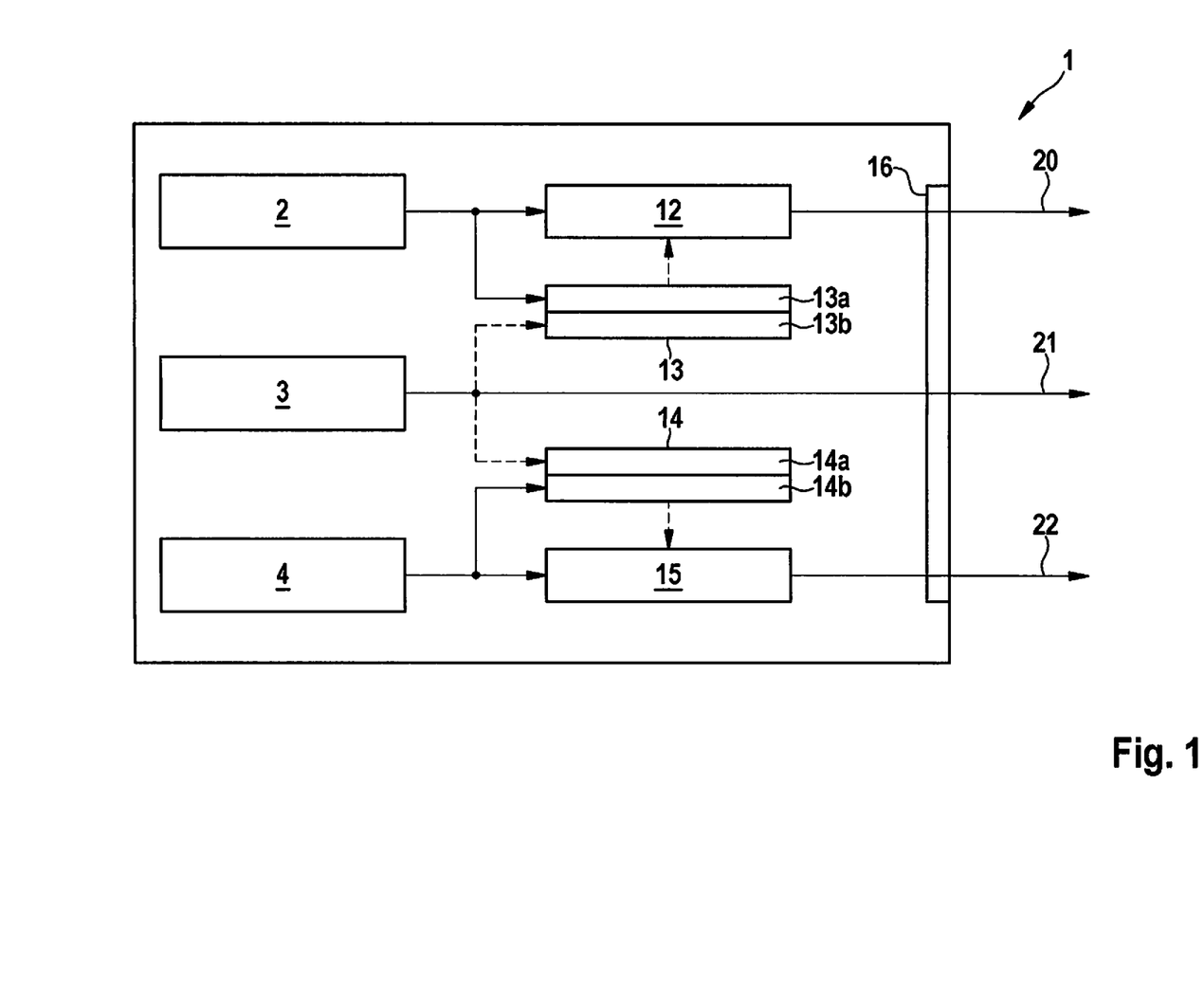
FIG. 1 schematically shows a sensor system according to one specific embodiment of the present invention.

FIG. 1 schematically shows a sensor system according to one specific embodiment of the present invention.

In detail, a sensor system 1 is shown in FIG. 1, which includes a magnetometer 2, a rotation rate sensor 3, and an acceleration sensor 4. Magnetometer 2 provides measured values of a magnetic field, rotation rate sensor 3 measures a rotation rate, and acceleration sensor 4 measures an acceleration. Magnetometer 2 and acceleration sensor 4 convey their values to a correction unit 13, 14, which determines correction parameters or correction data for calibrating the particular sensor signals or measuring signals. These may be estimated, for example. Correction unit 13, 14 includes a quality unit 13a, 14a, which determines a particular quality parameter for the particular correction parameter, and an ascertainment unit 13b, 14b, which ascertains correction parameters for the measuring signals of magnetometer 2 and acceleration sensor 4. Correction units 13, 14 may be separate units or may also be implemented in a shared correction unit. Quality units 13a, 14a may be separate units or also—as shown in FIG. 1—may be part of particular correction unit 13, 14. This applies accordingly to the ascertainment unit.

Furthermore, sensor system 1 includes a calibration unit 12 for the signal of magnetometer 2 and a calibration unit 15 for the signal of acceleration sensor 4. Particular ascertainment unit 13b, 14b or quality unit 13a, 14a conveys the corresponding determined correction parameters and the quality of the particular correction parameters to calibration unit 12, 15, which corrects a present measuring signal accordingly on the basis of the conveyed correction parameters.

A corrected measuring signal 20 for the magnetic field and a corrected acceleration signal 22 for the acceleration are output via an output unit 16. If rotation rate sensor 3 is activated, rotation rate sensor 3 also conveys the particular rotation rate to correction unit 13, 14, which ascertains correction parameters for the measuring signal of magnetometer 2 and acceleration sensor 4 with the aid of ascertainment unit 13b, 14b with additional use of the ascertained rotation rate. Quality unit 13a, 14a in turn determines a particular quality parameter for the particular determined correction parameters. Measuring signal 21 of rotation rate sensor 3 may also be output via the output unit.

In other words, correction parameters for magnetometer 2 and for acceleration sensor 4 are only determined with the aid of rotation rate sensor 3 when it is active, i.e., it is activated.

If rotation rate sensor 3 is not activated, a determination of the correction parameters is carried out solely on the basis of the particular sensor signals to be corrected, magnetic field or acceleration.

Depending on whether rotation rate sensor 3 of sensor system 1 shown in FIG. 1 was activated, a method for determining the correction parameters either only on the basis of the particular sensor signals of magnetometer 2 and acceleration sensor 4, or a method which makes use of the rotation rate of the rotation rate sensor in addition to the particular sensor signal of magnetometer 2 or acceleration sensor 4, is selected and executed.

In another specific embodiment, the method for determining the correction parameters may be carried out without use of rotation rate sensor 3 if rotation rate sensor 3 is activated.

Figure 2:
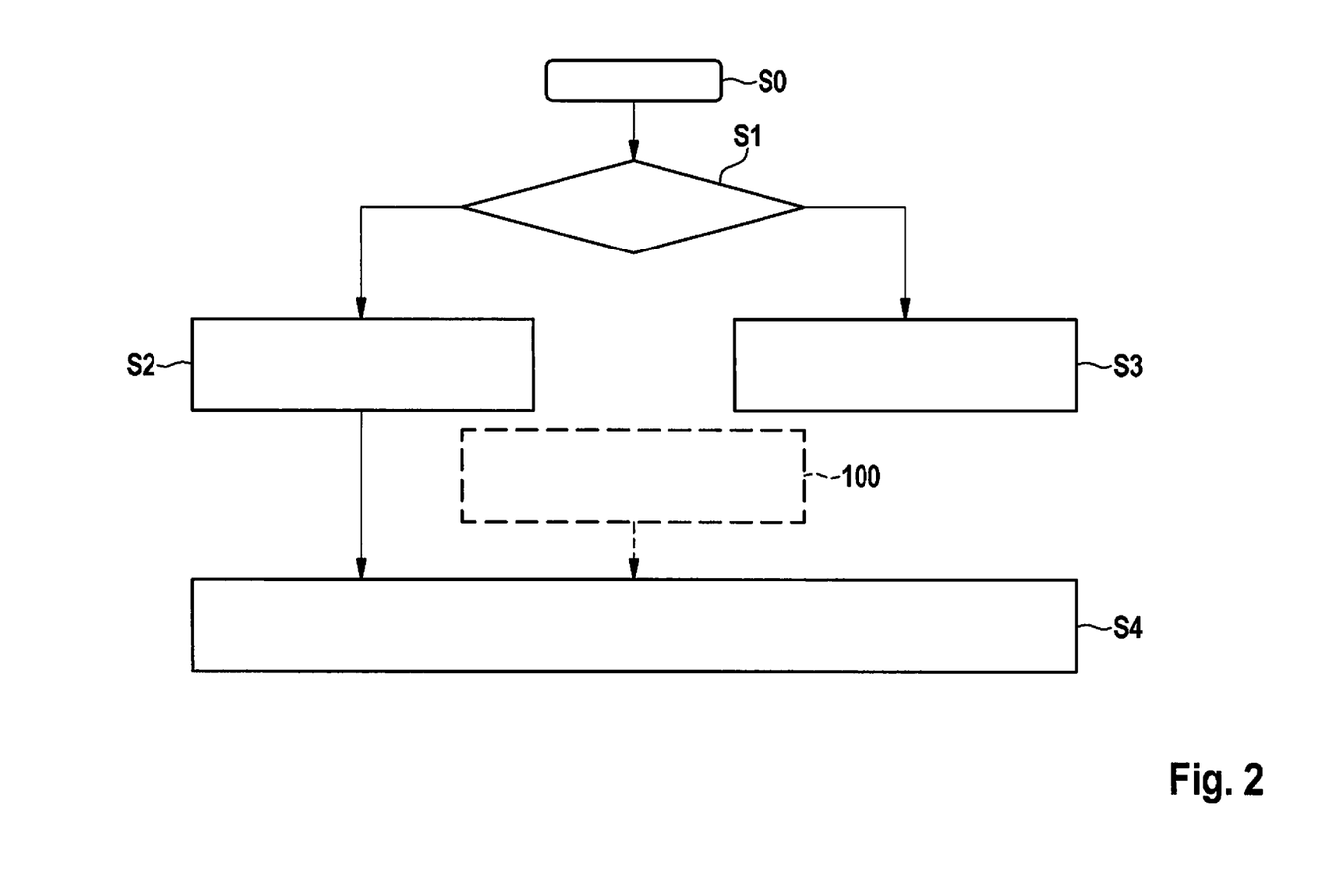
FIG. 2 shows parts of steps of a method according to one specific embodiment of the present invention.

FIG. 2 shows parts of steps of a method according to one specific embodiment of the present invention.

FIG. 2 shows a method for determining correction parameters with the aid of correction unit 13, 14 of FIG. 1.

After a startup (reference numeral S0), it is checked in a first step S1 whether rotation rate sensor 3 is activated. If it is not activated, a determination of the correction parameters without consideration of the signal of rotation rate sensor 3 takes place in a step S2. If the rotation rate sensor is activated, a determination of the correction parameters additionally takes place based on the signal of rotation rate sensor 3 in a step S3. In a fourth step S4, it is ascertained which correction parameters, on the one hand without consideration of the signal of rotation rate sensor 3, and on the other hand with consideration of the signal of rotation rate sensor 3, are finally conveyed to calibration unit 12, 15 for calibrating the particular signal.

Furthermore, a monitoring unit 100 is shown in FIG. 2, which is not part of correction unit 13, 14 here and the object of which is to detect chronologically significant changes in the ascertained correction parameters during the service life of sensor system 1. Such a change may take place, for example, due to the application of a new interfering variable or a strong temperature change or the like. If a change is detected, in particular a further determination of the correction parameters ascertained by the two methods is necessary. The heretofore ascertained correction parameters lose their validity and are no longer used for calibrating sensor system 1. However, the corresponding correction parameters may be stored to be used again later. Monitoring unit 100 then provides pieces of information about established changes of correction unit 13, 14.

Figure 3:
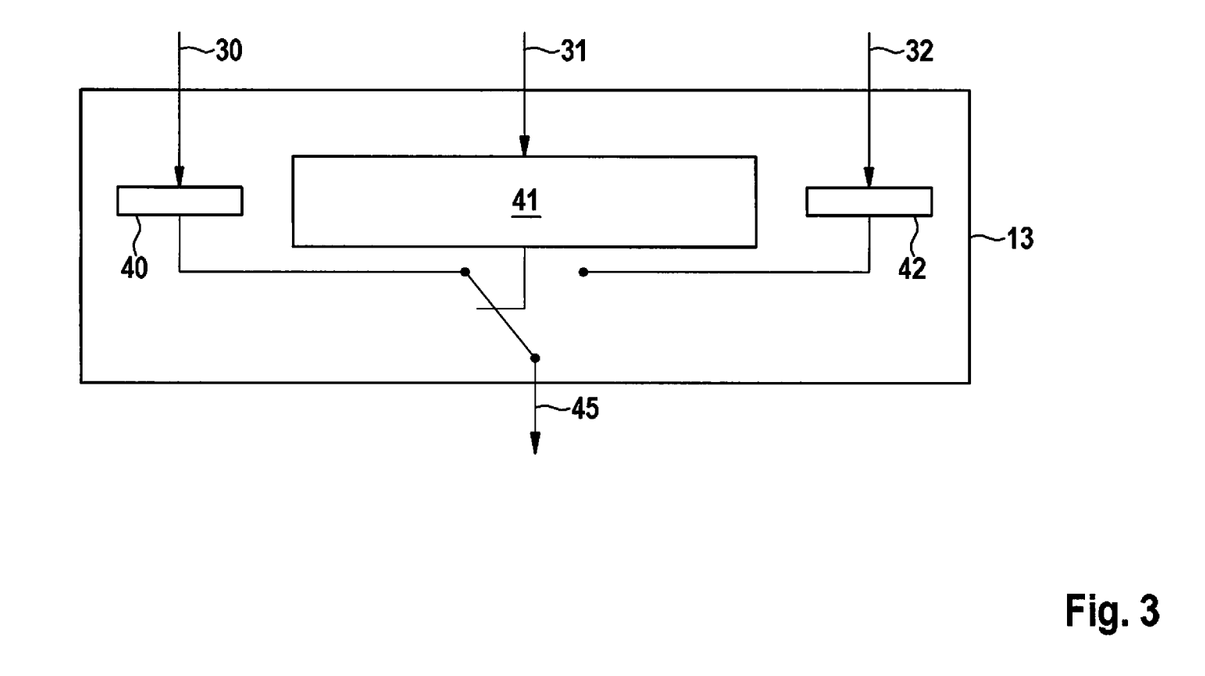
FIG. 3 shows a correction unit of a sensor system according to one specific embodiment of the present invention.

FIG. 3 shows a correction unit of a sensor system according to one specific embodiment of the present invention.

A correction unit 13 according to FIG. 1 for determining correction parameters for a calibration unit 12 is described in detail and with other words in FIG. 3. This applies accordingly to correction unit 14 for calibration unit 15. Ascertainment unit 13b of correction unit 13 ascertains present correction parameters, as shown in FIG. 3, from correction parameters already determined previously or beforehand, quality unit 13a ascertains the corresponding quality parameters, ascertained in each case, on the one hand without use of signals of rotation rate sensor 3 (reference numeral 30), and on the other hand with use of signals of rotation rate sensor 3 (reference numeral 32).

Furthermore, correction unit 13 receives a piece of information (reference numeral 31) by way of a monitoring unit 100, as shown in FIG. 2, as to whether the present correction parameters are still valid, i.e. have to be changed, and/or whether rotation rate sensor 3 is activated. The already determined particular correction parameters and the associated quality parameters were or are stored in corresponding memories 40, 42. Correction unit 13 then ascertains with the aid of an establishment unit 41 which of the already determined correction parameters has a higher quality and/or whether the present correction parameters still have validity and/or whether a maximum changing time has been reached.

In particular if a rotation rate sensor 3 is switched off, the correction parameters or correction data and the quality thereof may be stored in particular memory 40, 42. The determination of the particular correction parameters and also the particular quality thereof is no longer carried out, however. The decision as to whether these correction parameters are still to be used is made by correction unit 13.

On the basis of a corresponding result of establishment unit 41, together with the information as to whether the rotation rate sensor is activated or not, present correction parameters and a corresponding quality for the present correction parameters are ascertained and output by correction unit 13 (reference numeral 45).

In other words, correction unit 13, 14 determines, in particular continuously, on the one hand, correction parameters without incorporation of values of rotation rate sensor 3 and the associated quality parameter, and/or predetermined correction parameters with assistance of values of rotation rate sensor 3 and the associated quality parameter, if it is activated. Correction unit 13, 14 furthermore receives the piece of information of monitoring unit 100 as to whether a change of the present correction parameters, i.e., for example, a change of correction parameters with assistance of values of the rotation rate sensor to correction parameters without assistance of the rotation rate sensor 3 has taken place. If one of the methods for determining the predetermined correction parameters, i.e., with assistance of values of rotation rate sensor 3 or without, is deactivated, the last ascertained predetermined correction parameters and the associated quality, which were ascertained by the corresponding method, are stored in particular memory 40, 42 and the correction parameters stored in each case are determined by correction unit 13, 14 as correction parameters for conveyance to calibration unit 12, 15.

The following conditions may be met to "switch over" between the correction parameters of the two methods:

1. To be able to switch over to the correction parameters from the ascertainment method of the correction parameters without rotation rate sensor 3 and the associated quality, in particular rotation rate sensor 3 has to be deactivated. To be able to switch over to the correction parameters and the associated quality from the ascertainment method of the correction parameters with rotation rate sensor 3, rotation rate sensor 3 has to be activated.

2. Moreover, either:
   a. The quality of the correction parameters, to which a change is to be made, may be greater than or equal to the quality of the present correction parameters.
   or
   b. A change may have taken place in the present correction parameters, more precisely a change of the method for determining the correction parameters, and the present correction parameters have thus lost their validity.
   or
   c. The change, after the activation or deactivation of rotation rate sensors 3, may have exceeded a maximum changing time predetermined by monitoring unit 100.

The present correction parameters ascertained by correction unit 13, 14 and the associated quality parameter may subsequently be used for the signal correction of magnetometer 2 and/or acceleration sensor 4.

Figure 4:
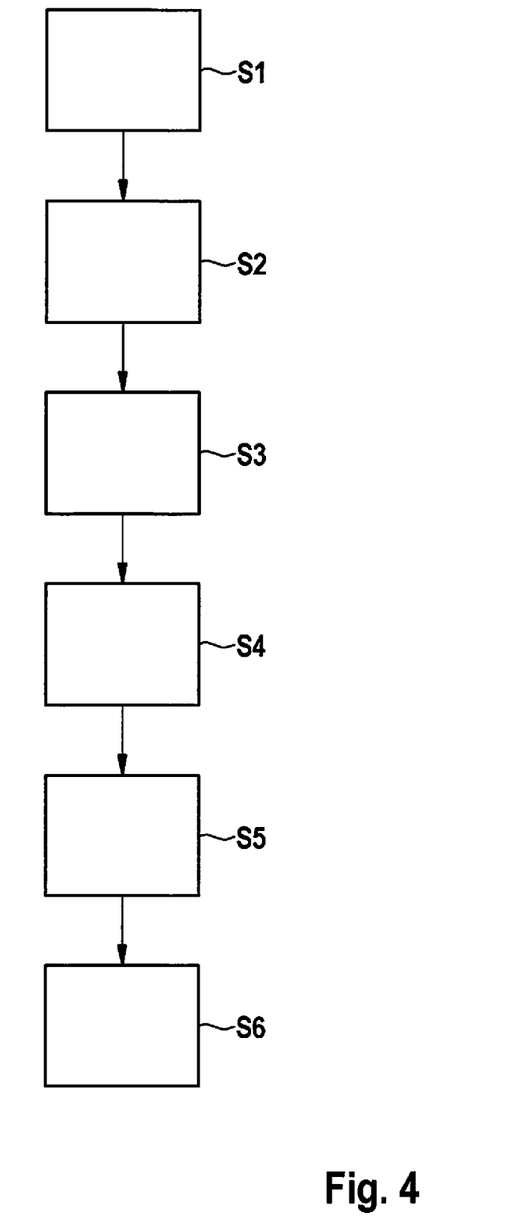
FIG. 4 shows steps of a method according to one specific embodiment of the present invention.

FIG. 4 shows steps of a method according to one specific embodiment of the present invention.

A method for calibrating a sensor system is shown in FIG. 4. The method includes the following steps.

In a first step S1, a provision of at least one first sensor unit and one second sensor unit takes place.

In a further step S2, a provision of first correction data for the first sensor unit takes place on the basis of measuring signals of the first sensor unit.

In a further step S3, a provision of second correction data for the first sensor unit takes place in the case of an activated second sensor unit on the basis of measuring signals of the first sensor unit and on the basis of measuring signals of the second sensor unit.

In a further step S4, a determination of a first quality parameter for the first correction data and a second quality parameter for the second correction data takes place.

In a further step S5, a determination of present correction data for measuring signals of the first sensor unit takes place based on the correction data having the highest of the two determined quality parameters.

In a further step S6, a calibration of the first sensor unit takes place by correcting first measuring signals on the basis of the present correction data.

In summary, at least one of the specific embodiments of the present invention includes at least one of the following advantages:

Simple implementation.

High efficiency.

High degree of accuracy with optimized power consumption at the same time.

Rapid determination of correction parameters.

Although the present invention was described on the basis of exemplary embodiments, it is not restricted thereto, but rather is modifiable in manifold ways.

What is claimed is:

1. A method of a sensor system for producing sensor output that characterizes a state sensed by the sensor system, the sensor system including a first sensor, a second sensor, a memory device, a correction unit, and a sensor monitor, the first sensor being an accelerometer or a magnetometer and the second sensor being a rotation rate sensor, the method comprising:

monitoring, by the sensor monitor, an activation status of the rotation rate sensor;

sensing, by the first sensor, an acceleration or a magnetic field, thereby generating corresponding first measuring signals;

based on the sensor monitor indicating that the activation status of the rotation rate sensor is inactive, performing the following while the rotation rate sensor is inactive:

generating, by the correction unit, first correction data based on the first measuring signals without input from the rotation rate sensor and a first quality value representing a quality of the first correction date; and storing, by the sensor system, the first correction data and the first quality value in the memory device, the first correction data being set as current correction data;

correcting, by the correction unit, the first measurement signals based on the current correction data to generate first corrected measurement signals;

outputting, by the sensor system, the first corrected measurement signals;

subsequent to the generation of the first correction data, in response to the monitoring resulting in the activation status being detected to be that the rotation rate sensor has been switched to be in an activated state to sense a rotation rate and generate rotation rate data to be output by the sensor system:

generating, by the correction unit, (a) second correction data based on a combination of second measuring signals generated by the first sensor and the rotation rate data generated due to the switching of the rotation rate sensor into the activated state and (b) a second quality value representing a quality of the second correction date; and storing, by the sensor system, the second correction data and the second quality value in the memory device selecting, by the correction unit and as an update of the current correction data, whichever one of the first correction data and the second correction data whose corresponding quality value is higher than the other quality value;

correcting, by the correction unit, the second measuring signals based on the updated current correction data to generate second corrected measurement signals; and outputting, by the sensor system, the second corrected measurement signals and the rotation rate data.

2. The method of claim 1, wherein, in response to the selection, removing whichever of one of the first correction data and the second correction data whose corresponding quality value is lower from the memory device, while maintaining the selected one of the first and second correction data in the memory device.

3. The method of claim 1, wherein the sensor system further includes a timer, and the method further comprises:

monitoring, by the sensor system, a value of the timer;

continuously using the selected one of the first and second correction data as the current correction data for correcting new measuring signals generated by the first sensor without obtaining additional new correction data until the sensor system determines, based on the monitoring of the timer value, that a predefinable time span has elapsed, in response to which the sensor system generates new correction data to replace the previously stored correction data in the memory device.

4. The method of claim 1, wherein the updated current correction data is continuously used without obtaining further correction data until being triggered, and the method further comprises:

monitoring, by a further sensor of the sensor system, whether a trigger event has occurred; and in response to the trigger event being determined, by the monitoring, to have occurred, triggering the obtaining of the further correction data.

5. The method of claim 1, wherein the trigger event is a change in temperature.

6. A sensor system comprising:

a first sensor, which is an accelerometer or a magnetometer that is configured to sense an acceleration or a magnetic field, thereby generating corresponding first measuring signals;

a second sensor, which is a rotation rate sensor;

a memory device;

a correction unit; and a sensor monitor;

wherein, for producing sensor output that characterizes a state sensed by the sensor system:

the sensor monitor is configured to monitor an activation status of the rotation rate sensor;

based on the sensor monitor indicating that the activation status of the rotation rate sensor is inactive:

while the rotation rate sensor is inactive, the correction unit is configured to generate first correction data based on the first measuring signals without input from the rotation rate sensor, and to generate a first quality value representing a quality of the first correction date; and while the rotation rate sensor is inactive, the sensor system is configured to store the first correction data and the first quality value in the memory device, the first correction data being set as current correction data;

the correction unit is configured to correct the first measurement signals based on the current correction data to generate first corrected measurement signals;

the sensor system is configured to output the first corrected measurement signals;

subsequent to the generation of the first correction data, in response to the monitoring resulting in the activation status being detected to be that the rotation rate sensor has been switched to be in an activated state to sense a rotation rate and generate rotation rate data to be output by the sensor system:

the correction unit is configured to generate (a) second correction data based on a combination of second measuring signals generated by the first sensor and the rotation rate data generated due to the switching of the rotation rate sensor into the activated state and (b) a second quality value representing a quality of the second correction date; and the sensor system is configured to store the second correction data and the second quality value in the memory device;

the correction unit is configured to select, as an update of the current correction data, whichever one of the first correction data and the second correction data whose corresponding quality value is higher than the other quality value;

the correction unit is configured to correct the second measuring signals based on the updated current correction data to generate second corrected measurement signals; and the sensor system is configured to output the second corrected measurement signals and the rotation rate data.

* * * * *